(12) United States Patent
Leerkamp

(10) Patent No.: US 7,078,092 B2
(45) Date of Patent: Jul. 18, 2006

(54) RADIATION SHIELDING GASKET, AS WELL AS MANUFACTURING METHOD

(75) Inventor: Peter Leerkamp, Boxmeer (NL)

(73) Assignee: Stork Prints B.V., Boxmeer (NL)

( * ) Notice: Subject to any disclaimer, the term of this patent is extended or adjusted under 35 U.S.C. 154(b) by 0 days.

(21) Appl. No.: 10/491,079

(22) PCT Filed: Sep. 26, 2002

(86) PCT No.: PCT/NL02/00619

§ 371 (c)(1),
(2), (4) Date: Mar. 29, 2004

(87) PCT Pub. No.: WO03/034800

PCT Pub. Date: Apr. 24, 2003

(65) Prior Publication Data

US 2004/0247851 A1 Dec. 9, 2004

(30) Foreign Application Priority Data

Oct. 2, 2001 (NL) .................................. 1019088

(51) Int. Cl.
*B32B 3/26* (2006.01)
*B05D 5/12* (2006.01)
(52) U.S. Cl. ............... 428/319.1; 428/315.5; 428/315.7; 427/243
(58) Field of Classification Search ............. 428/319.1, 428/315.5, 315.7; 427/243
See application file for complete search history.

(56) References Cited

U.S. PATENT DOCUMENTS

| 3,634,184 | A | * | 1/1972 | Wang ........................... 442/64 |
| 4,576,859 | A | | 3/1986 | Oyachi et al. ............ 428/311.1 |
| 5,846,462 | A | * | 12/1998 | Thompson .................... 264/51 |
| 6,178,318 | B1 | | 1/2001 | Holmberg et al. .......... 455/300 |
| 6,255,581 | B1 | | 7/2001 | Reis et al. .............. 174/35 GC |
| 6,309,742 | B1 | | 10/2001 | Clupper et al. .......... 428/304.4 |
| 2003/0087079 | A1 | * | 5/2003 | Okabe et al. |

FOREIGN PATENT DOCUMENTS

| EP | 0 520 695 A2 | 6/1992 |
| JP | 2001293829 A | * 10/2001 |
| WO | WO 00/00345 | 6/1992 |

* cited by examiner

*Primary Examiner*—Hai Vo

(74) *Attorney, Agent, or Firm*—Hoffman & Baron, LLP

(57) ABSTRACT

A gasket which shields against interfering radiation and comprises a metallized plastic foam has a network of open cells which are in communication with one another and is used, for example, to seal any gap between an earth wire on a PCB and cover which shields against interfering radiation. According to one aspect, the cells (34) are oriented in the height direction of the gasket in such a manner that the elastic compressibility of the gasket is at least 80% in the height direction.

11 Claims, 1 Drawing Sheet

RADIATION SHIELDING GASKET, AS WELL AS MANUFACTURING METHOD

CROSS-REFERENCE TO RELATED APPLICATIONS

This application is the National Stage of International Application No. PCT/NL02/00619, filed Sep. 26, 2002, which claims the benefit of Netherlands Application No. NL 1019088, filed Oct. 2, 2001, the contents of which is incorporated by reference herein.

FIELD OF THE INVENTION

The present invention relates to a radiation shielding gasket, comprising a plastic foam with a network of open cells which are in communication with one another, which is provided with a layer of a conductive metal.

BACKGROUND OF THE INVENTION

A gasket of this type and a method for its manufacture are known, for example, from U.S. Pat. No. 4,576,859. Shielding of electronic devices is used either to shield an electronic device itself from external interfering radiation or to shield the environment from radiation which is generated by the electronic device itself, or for both purposes. Shielding of an electronic component in this way on a printed circuit board, referred to below as PCB for short, can be achieved with the aid of a cap made from an electrically conductive material which is placed over the electronic component which is to be shielded and is connected via the electrically conductive gasket to an earth wire on the PCB. The gasket is used to fill the gaps between the cap, which appears to provide a good closure, and the PCB and thus to prevent leakage of radiation.

The above-mentioned known gasket comprises a foamed body of plastic with a three-dimensional skeleton structure, the skeleton surface of which is provided with a metal covering layer, and a covering of a conductive rubber and/or plastic applied to it. This gasket is manufactured by providing an open-celled foam, for example a polyurethane foam from which the membranes have been partially removed by means of a treatment with a base, with a metal covering layer, for example by means of electroless plating of nickel. Since the original elasticity of the foam is lost as a result of the deposition of metal on the plastic foam, the metal deposit is deliberately partially broken during a subsequent deformation operation. The pores are then or simultaneously filled with a conductive rubber and/or plastic. The deformation takes place by compression of the metallized foam. The rubber is used to bind metal particles which come free, for example as a result of the deformation operation, so that they cannot come into contact with the electronic components and/or printed circuit, which could cause a short circuit.

One drawback of this known gasket, in particular the material from which it is manufactured, is its weight. After all, impregnation of the metallized plastic foam with the conductive rubber or plastic results in a relatively heavy material. In addition, there is a risk of the plastic foam ageing as a result of hydrolysis. Hydrolysis of this nature leads to the foam being crushed, during which process metal particles can come free and may cause short circuits. In general terms, the durability of the known gaskets leaves something to be desired.

SUMMARY OF THE INVENTION

It is an object of the present invention to provide a gasket protecting against leakage of electromagnetic radiation which eliminates or reduces the above-mentioned drawbacks.

To this end, according to the intention the gasket of the type described above is characterized in that the cells are oriented in the height direction of the gasket, in such a manner that the elastic compressibility in the height direction of the gasket is more than 80%. According to this aspect of the invention, the assembly of plastic foam and metal layer applied thereto have an elastic compressibility of more than 80%, with the result that the gasket bears excellently against and makes electrical contact with on one side an earth wire on a PCB, for example, and on the other side a shielding cover. There are no interruptions in this contact, so that appropriate shielding is ensured. Also, any change in the distance between earth wire and cover, both locally and over the course of time, are compensated for by the resilience of the gasket. In the gaskets according to the prior art, the elastic compressibility was insufficient to achieve this. In this context, the plastic foam plays a relatively important roll, since this both makes the maximum contribution to the elasticity and compressibility and supports or carries the metal. It should be noted that the term "elastic compressibility" is understood as meaning the property of allowing compression to the stated level under load and virtually returning to the original shape when the load is removed. In this case, a compressibility of more than 80% means that a gasket with a height (thickness) of 1 cm can be compressed at least 8 mm. The height direction is the direction between the ground track and the cover. The cells of the plastic foam are oriented with their longitudinal direction in the height direction of the gasket, i.e., the longitudinal direction of the cells extends from the surface by which the gasket is secured to the PCB to the surface by which the gasket is secured to the cap or cover. The height of the gasket will generally lie between 1.0 and 3.0 m. Its width is generally 0.6–2.0 mm. It is preferable for at least 1.5 cell of the plastic foam to be present as seen in the width of the gasket, since this ensures that an uninterrupted shielding metal layer is present. The above conditions mean that the compressibility does not have to be at least 80% in all directions.

According to a second aspect of the invention, the plastic foam used is anisotropic. Selecting an anisotropic plastic foam, i.e. a plastic foam with direction-dependent properties, as starting material for the manufacture of the gasket according to the invention allows the elastic compressibility to be improved over the known material. It is preferable for this elastic compressibility to be more than 80% and/or for the cells to be oriented in the height direction, as defined in the aspect described above. Furthermore, it is possible that a very thin layer of metal will suffice, so that this layer does not reduce the elastic compressibility to an unacceptable degree. The deposit of metal is also flexible to a sufficient extent for it not to be broken during load, partly on account of the support from plastic foam, while it is also not necessary for the open cells to be filled with a conductive synthetic rubber in order to retain particles which have broken off. Therefore, the invention creates a very lightweight metal gasket.

In the invention, it is advantageous for polyurethane foam based on polyether to be used as starting material, since it is hydrolytically stable and therefore undergoes scarcely any ageing with all the associated drawbacks.

Plastic foam with a network of open cells which are in communication with one another can be obtained by partially breaking open the walls (membranes) of plastic which delimit air bubbles, so that a network of pores or cells which are in communication with one another is formed. Obviously, part of the walls remains in place. The cell dimensions (cell size) are advantageously in the range from 150–750 micrometers, more preferably 200–450 micrometers. In the specialist field, the term "cell sized" is understood as meaning the mean value for the maximum diameter of the circular cross section of a number of cells.

As has already been noted above, the layer of metal is thin, so that the elasticity and compressibility of the gasket do not deteriorate significantly as a result of the layer of metal. The metal used for the metal layer may be selected, for example, from nickel, copper, stainless steel, aluminium and titanium and alloys thereof. Indium and tin and alloys thereof can also be used. Nickel is preferred.

The density of the plastic foam is advantageously in the range from 30–70 kg/m$^3$. Nickel can be deposited in a density of 10–100 kg/m$^3$, preferably approximately 30 kg/m$^3$. The density of the gasket is then in the range from 40–170 kg/m$^3$.

The present invention also relates to a method for producing a gasket according to the invention, which method comprises the steps of depositing a conductive metal on a plastic foam with a network of open cells which are in communication with one another and forming a gasket therefrom. The method according to the invention is characterized in that the conductive metal is deposited in such a manner on the plastic foam, the cells of which are oriented in the height direction of the gasket, that the elastic compressibility of the gasket in the height direction is at least 80%. The result is a gasket with an excellent compressibility and resilience. According to a further aspect, the metal is deposited on an anisotropic plastic foam, so that the elastic compressibility is excellent in at least one direction, which is preferably used as the height direction of the gasket.

It is advantageous first of all to make the plastic foam conductive by depositing a thin layer of the conductive metal on it, and then to deposit a thicker layer of the same or a different metal on this thin layer by means of electroforming. For example a thin layer of copper or nickel is deposited by sputtering. Tin can be vapour-deposited or applied by passing the foam through a molten pool of tin (the melting point of tin is approximately 260° C.). A plastic foam which has been prepared in this way can then be electroformed with nickel, indium or tin until the desired layer thickness has been reached. The electroformed top layer preferably has a thickness of more than 0 up to approximately 10 micrometers.

The gasket according to the invention is used in electronic devices which may be sensitive to interfering radiation, such as electromagnetic radiation, for example electronic regulating, control or switching devices, and communication- and data-processing equipment. Examples of such devices include microdata processors, computers, integrated circuits, microswitches, mobile telephones, transmitting and receiving equipment, paging equipment, television, etc.

BRIEF DESCRIPTION OF THE DRAWINGS

The invention is explained below with reference to the appended drawing, in which.

DETAILED DESCRIPTION OF PREFERRED EMBODIMENTS

Figure 1:
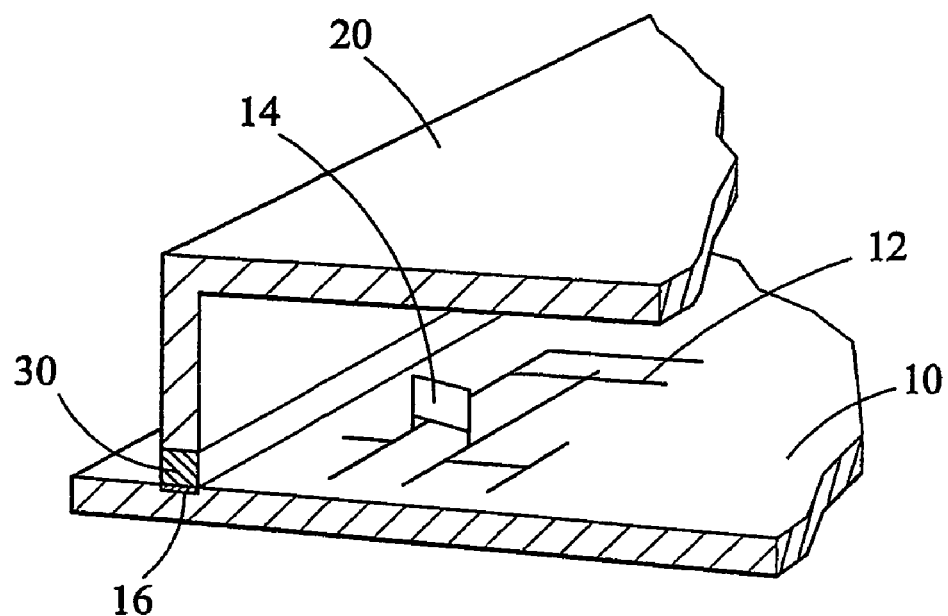
FIG. 1 shows a diagrammatic embodiment of a PCB with shielding.

FIG. 1 shows a board 10 which is provided with a printed circuit 12. An electronic component 14 is electrically connected to the printed circuit 12. Furthermore, there is a separate ground wire 16 on the PCB. A cap 20 of electrically conductive material has been positioned over the electronic component 14 in order to shield the electrical component from external interfering radiation and to shield the environment from radiation generated by the electronic component. The thickness of the cap is approximately 0.8 mm. Between the cap and the ground wire 16 there is a gasket 30 according to the invention. The shape of the gasket is matched to that of the ground wire 16 and cap 20. The gasket prevents leakage of interfering radiation either inwards or outwards through the gap which would otherwise be present between the cap 20 and the ground wire 16.

Figure 2:
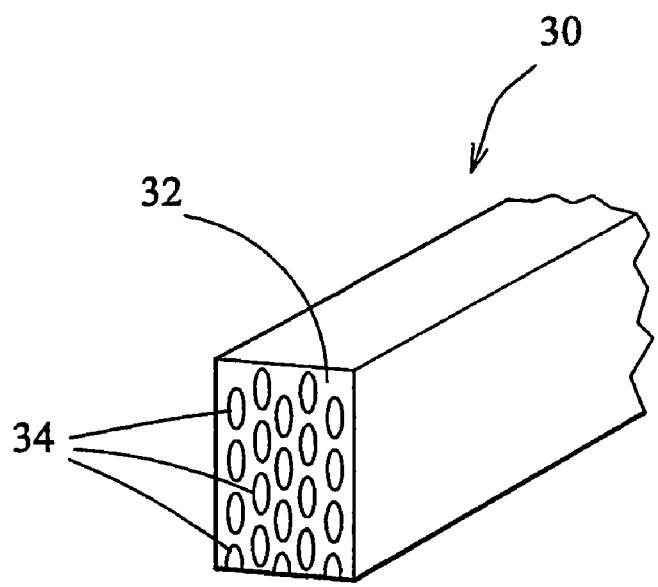
FIG. 2 shows a perspective view of a cross section through the material from which the gasket according to the invention is manufactured.

As can be seen from FIG. 2, the gasket 30 consists of a foam material 32, in particular a polyurethane foam with polyether chains with a cell dimension of 400 micrometers, on which a metal layer (not shown) of tin with a thickness of 2 micrometers has been deposited. All the cells 34 are oriented in the vertical height, i.e. the longitudinal direction of the cell 34 runs parallel to the vertical height of the gasket 30. The result is a gasket material with excellent resilience in the vertical height. In the case of a gasket of this type with a thickness of 1.5 mm, this gasket can be compressed to a thickness of 0.3 mm, while after the load is removed the gasket springs back to a thickness of more than approximately 1.0 mm. In addition, the electrical resistance in the vertical height is low compared to foam with substantially round cells, which is favourable for the shielding properties.

The invention claimed is:

1. A radiation shielding gasket for use between a ground track of an electronic device to be shielded and a cover, comprising a plastic foam with a network of open cells which are in communication with one another, which foam is provided with a layer of conductive metal, wherein the plastic foam is an anisotropic foam, of which foam the cells are oriented with their longitudinal direction in the height direction between a ground track and said cover.

2. The gasket according to claim 1, wherein the plastic foam is polyurethane foam based on polyether.

3. The gasket according to claim 1, wherein the elastic compressibility in the height direction of the gasket is more than 80%.

4. The gasket according to claim 1, wherein the dimensions of the cells lie in the range of 150–750 micrometers.

5. The gasket according to claim 1, wherein the density of the gasket is in the range of 40–170 kg/m$^3$.

6. The gasket according to claim 1, wherein the thickness of the metal layer is more than 0 up to approximately 10 micrometers.

7. The gasket according to claim 1, wherein the metal of the metal layer is nickel.

8. An electronic device having at least one electronic component to be shielded comprising a base carrying said electronic component and a ground track, a radiation shielding gasket and a cover, wherein the radiation shielding gasket comprises a plastic foam with a network of open cells which are in communication with one another, which foam is provided with a layer of a conductive metal, wherein the plastic foam is an anisotropic foam, of which foam the cells are oriented with their longitudinal direction in the height direction between said ground track and said cover.

9. A method for manufacturing a radiation shielding gasket for use between an electronic device ground track of a device to be shielded and a cover, which method comprises the steps of depositing a layer of a conductive metal on a plastic anisotropic foam with a network of open cells which are in communication with one another, and forming the gasket therefrom, wherein the layer of a conductive metal is deposited on the anisotropic foam, of which foam the cells are oriented with their longitudinal direction in the height direction between said ground track and said cover.

10. The method according to claim 9, wherein the metal is deposited on polyurethane foam based on polyether.

11. The method according to claim 9, wherein the conductive metal is deposited in such a manner that the elastic compressibility of the manufactured gasket in the height direction is at least 80%.

* * * * *